United States Patent [19]

Ward

[11] Patent Number: 5,565,807
[45] Date of Patent: Oct. 15, 1996

[54] BICMOS POWER-UP CIRCUIT WITH HYSTERESIS

[75] Inventor: Michael G. Ward, Saco, Me.

[73] Assignee: National Semiconductor Corporation, Santa Clara, Calif.

[21] Appl. No.: 307,926

[22] Filed: Sep. 16, 1994

[51] Int. Cl.$^6$ .................................................. H03K 3/037
[52] U.S. Cl. ............................ 327/205; 327/143; 327/545
[58] Field of Search ............................... 327/74, 77, 78, 327/108, 87, 143, 205, 545, 546

[56] References Cited

U.S. PATENT DOCUMENTS

| | | | |
|---|---|---|---|
| 4,254,327 | 3/1981 | Ray | 327/143 |
| 4,385,243 | 5/1983 | Suzuki | 327/143 |
| 4,481,430 | 11/1984 | Houk et al. | |
| 4,888,498 | 12/1989 | Kadakia | 327/546 |
| 5,051,611 | 9/1991 | Kantz | |
| 5,336,946 | 8/1994 | Segaram et al. | 327/108 |

*Primary Examiner*—Timothy P. Callahan
*Assistant Examiner*—Jung Ho Kim
*Attorney, Agent, or Firm*—Thomas L. Bohan; Chris A. Caseiro

[57] ABSTRACT

A BiCMOS power-up circuit for delaying the operation of an extended circuit until the voltage available to the high-potential power rail of the extended circuit is sufficiently high that all elements of the extended circuit will be powered at a high enough voltage to function correctly. The power-up circuit of the present invention has its most direct application to three-state output buffers connected to a common bus, and in this context this circuit can maintain the output buffers in their high-Z, inactive state until the voltage available from the circuit-energizing power-supply has risen high enough that all of the stages of the buffers will operate correctly, and in particular will not be current-sourcing and current-sinking simultaneously. By the use of a primary control path and a secondary control path, the circuit of the present invention is able to manifest a hysteresis wherein during power-up the circuit of the present invention cedes control of the extended circuit at a power-supply threshold voltage $V_{ThU}$ which is higher than the threshold voltage $V_{ThD}$ at which the circuit re-asserts control during power-down. This avoids unnecessary turn-offs of the extended circuit occasioned by load-, noise-, and temperature-induced fluctuations in the high-potential power rail voltage, while allowing $V_{ThU}$ to be set quite high. By using bipolar and MOS transistors, the circuit of the present invention is able to make use of the specific advantages of each type of device.

13 Claims, 5 Drawing Sheets

BICMOS POWER-UP CIRCUIT WITH HYSTERESIS

BACKGROUND OF THE INVENTION

1. Field of the Invention

This invention relates generally to the field of circuits used to synchronize the energizing of various parts of an extended circuit. A circuit such as that of this invention is characterized as a "power-up circuit," and serves to delay the application of electrical power at power-up until the level of voltage available to the extended circuit is sufficiently high to ensure that all parts of that extended circuit can operate properly. More particularly, the circuit of the present invention can serve to delay the application of power to the output pull-up and pull-down stages in output buffers until those stages can be controlled by the rest of the output buffer and associated circuitry. More particularly yet, the present invention can provide a means of delaying circuit activation until the rising power-supply-voltage is sufficiently high to ensure that the output buffer is placed in a definite state before its pull-up and pull-down stages are energized. Yet more particularly, the present invention—using a combination of MOSFET and bipolar transistor circuitry—introduces a hysteresis into the energizing/de-energizing process such that the turn-on-threshold-voltage marking the point at which the power-supply-voltage is applied to the extended circuit as the power supply voltage is rising is significantly higher than the turn-off-threshold-voltage marking the point at which the power-supply-voltage is removed from the extended circuit as the power-supply-voltage is falling. This permits a relatively high turn-on-threshold-voltage to be set, without a concern that the circuit will be de-energized by normal fluctuations in the applied power supply voltage.

Another sub-field in which the circuit of the present invention can be categorized is that of reset circuits, i.e., circuits used to set to logic-low the levels of a group of logic stages in an extended circuit or, more generally, to set the levels of the logic stages to definite values, logic-low or logic-high.

2. Description of the Prior Art

In general, power is supplied to an extended logic circuit by a power supply connected across the circuit. This generally is accomplished by connecting the low-potential power rail of the logic circuit to ground and connecting the high-potential power rail to the high side of the power supply, the low side of which is grounded. (The high-potential power rail voltage for which the circuit is designed to operate is usually referred to as $V_{CC}$, and the voltage on the low-potential power rail as GND.) Normally the power supply is part of the circuitry and when ac power is provided to the power supply input the dc output voltage of that power supply—$V_{ps}$—will not instantaneously rise to the full design voltage for the high-potential power rail of the logic circuit. Rather, the power-supply-voltage $V_{ps}$ will commence at ground level and ramp up more or less linearly to the design voltage over a interval on the order of milliseconds. Problems arise because parts of the extended logic circuit will become active long before $V_{ps}$ brings the high-potential power rail up to the level where the entire circuit is operating properly. This can result in various stages being placed in indeterminate states rather than in one of the two well-defined binary states: logic-high and logic-low. This in turn can result in excess power dissipation both within the circuit and from the common bus to which the circuit is ultimately coupled.

In general, each of a plurality of logic circuits will be coupled to a common bus through a three-state output buffer, with provision for ensuring that at most one of the output buffers is active at a time. This is done through an output enable gate. There will be an output enable gate signal for each of the buffers. The problem during power-up is that bipolar logic outputs start conducting before the voltage on the high-potential power rail reaches the level necessary for an effective disenabling signal to be sent to the output enable gate. The consequence is that one or more (or even all) of the output buffers may be active (enabled) during this interval, with their outputs either current-sinking or current-sourcing. In the alternative, those buffers may be both current-sourcing and current-sinking, a most undesirable situation from a power dissipation perspective, where the high-potential power rail is coupled to the low-potential power rail through the output stages of one or more of the output buffers.

The usual approach in solving this problem is to couple to each output buffer a power-up circuit that will generate at an early stage in the ramping up of $V_{ps}$ a signal to hold the output buffer in its inactive state (that is, the "high-Z state" or simply "Z state"). The power-up circuit is a "fix" added to the main circuit to make up for the fact that the main circuit cannot generate a disabling signal—or simply a signal designed to ensure that all stages are in a definite logic state—soon enough. A power-up circuit is intended to generate an output voltage $V_{PU}$ which is in a definite logic state by the time that $V_{ps}$ reaches the level at which any of the logic outputs start conducting. That definite-logic-state signal can then be used to ensure that the output logic buffer is disabled, when the power-up circuit is used in connection with a three-state output buffer tied to a common bus. A generic array of such a buffer/bus circuit incorporating a power-up circuit is depicted in FIG. 1, which shows the output enable gate (OEG) to be an OR gate with one input from the power-up circuit and the other from that part of the circuit that generates the output enabling signal once the circuit is in operation, i.e., once the voltage on the high-potential power rail is at operative levels. With this particular layout, it can be seen that as long as the power-up output $V_{PU}$ is logic-low the OEG will send a disabling signal to the output buffer ensuring that that buffer presents a high-Z appearance to the common bus. During power-up, therefore, the power-up circuit must output a voltage $V_{PU}$ that is logic-high throughout the values of $V_{ps}$ for which the logic circuits can conduct, but a definite-state disabling signal nOE cannot be generated. For transistor-transistor logic (TTL)—i.e., bipolar logic—this will be the range from about 2 $V_{BE}$ to 4 $V_{BE}$, with $V_{BE}$ being defined as the voltage drop across the base and emitter nodes of a bipolar transistor. Thus the requirement is that the power-up circuit must output a logic-high signal during ramp-up as $V_{ps}$ is varying from 2 $V_{BE}$ to 4 $V_{BE}$, and that it then be locked at logic low so as to return control of the buffer to nOE.

Early power-up circuits are described in Houk et al. (U.S. Pat. No. 4,481,430, issued 1984) and in Krantz (U.S. Pat. No. 5,051,611, issued in 1991). The basic circuit of Houk is shown in FIG. 2 (Prior Art). It can be seen that as $V_{ps}$ ramps up from ground, the power-up output voltage $V_{PU}$ will first follow $V_{ps}$, since there will be no current through resistor R3 and hence no voltage drop across that resistor. That is, transistor Q1 will be non-conducting until $V_{ps}$ is high enough to cause forward conduction through diodes D1 and D2 and provide base drive to Q1. Q1 will not conduct until the drop across R2 equals $V_{BE}$, the voltage required across the base-emitter junction of Q1 to turn on the transistor. The "forward" base-emitter voltage drop will be taken to be the same across all transistors, and also to be the forward-conduction voltage drop for all the circuit diodes (which are generally bipolar transistors themselves with the collector and base nodes tied together). Thus it can be seen that Q1 will turn on when $V_{ps}$ reaches a voltage $[3+R1/R2]V_{BE}$, or about 4 $V_{BE}$ when the R1 and R2 resistors are comparable to one another. When Q1 turns on the output of the power-up circuit will fall to $V_{sat}$ (the collector-emitter drop across a conducting bipolar transistor of the circuit) and will remain there as long as $V_{ps}$ remains above $[3+R1/R2]V_{BE}$. For this duration, $V_{PU}$ will be locked at logic-low. The gate to which $V_{PU}$ is connected-generally an OR gate as shown in FIG. 1—is wired so that a logic-low $V_{PU}$ does not have any effect on the state of the output buffer. It can be seen, then, that for $V_{ps}>[3+R1/R2]V_{BE}$ the power-up circuit cuts out (cedes control of the buffer). As is shown in Houk et al., the output of their power-up circuit is connected to an OEG in such a way that when $V_{PU}$ exceeds about 2 $V_{BE}$ the output of the OEG will be logic-low, regardless of the nOE signal. Thus, the presence of the power-up circuit of Houk et al. ensures that the output buffer is disabled for 2 $V_{BE}<V_{ps}<4$ $V_{BE}$. The power-supply-voltage at which the power-up circuit yields control, 4 $V_{BE}$ in this prior-art circuit, is the ramp-up threshold. Because of the design of the power-up circuit of Houk et al., as shown in FIG. 2, it can be seen that as the $V_{ps}$ voltage drops below the ramp-up threshold—because of powering down of the circuit or because of fluctuations in the power-supply-voltage—transistor Q1 will turn off and the power-up circuit will re-assert control, disabling the buffer. Note in particular that with the prior-art circuit of FIG. 2, this will occur at the same voltage as that of the power-up threshold, i.e., at 4 $V_{BE}$ if R1=R2. This is undesirable, because once the buffers and their peripheral circuits are powered up, they can tolerate high-potential power rail voltages considerably below what they can tolerate during power-up. Because of this it is desirable to be able to introduce a certain hysteresis in the power-up circuit operation, a hysteresis whereby the turn-on threshold is higher than the turn-off threshold. In this way the circuit—and the bus to which it is coupled—can be safeguarded during power up and also safeguarded against unnecessary shutdowns when $V_{ps}$ voltage falls below the power-up threshold because of load-, noise, and/or temperature-induced fluctuations not incompatible with proper functioning of the circuit.

The circuit of Kantz addresses the susceptibility of earlier power-up circuits to cause unwanted shut downs due to fluctuations in the high-potential power rail voltage. It does this by introducing a hysteresis such that, once the power-up circuit has relinquished control over the extended circuit—at the $V_{ps}$ up-threshold $V_{UTh}$—it will not reassert that control until $V_{ps}$ has fallen below a different threshold, the down-threshold $V_{DTh}$, where $V_{DTh}<V_{UTh}$. FIG. 3 depicts the essence of the power-up circuit of Kantz. As $V_{ps}$ increases from ground potential the diode stack is at first not conducting; transistor Q3 receives no base drive and hence is 'off.' The output voltage of the power-up circuit is equal to $V_{ps}$ during this interval. Once $V_{ps}$ exceeds $V_{BE}$, transistor Q2 turns on. However, the output voltage $V_{PU}$ continues to track $V_{ps}$, since Q3 remains off and the base current through Q2 will result in negligible voltage drop across resistor R7. There will, however, be current through R4, and a corresponding voltage drop across R4. Initially, this current all passes through Q2. When $V_{ps}$ reaches a certain voltage, however, the diode stack consisting of D3 and D4 will start conducting and the current through R4 will then be the sum of the respective currents through the diode stack branch and through Q2. As $V_{ps}$ continues to increase, it will pass the threshold $V_{UTh}$ at which base drive is supplied to Q3; at this point, $V_{PU}$ will drop to $V_{SAT}$ and constitute a logic-low signal which through other circuitry, will yield control over the output buffer. This also will result in Q2 turning off for lack of base drive. (This turning-off of Q2 is essential to the hysteresis effect in Kantz.) During the period after this power-up circuit has yielded control, all of the current through R4 passes through the diode stack. Consequently, when $V_{ps}$ decreases—either during power-down or during a transitory fluctuation—it falls off to a voltage $V_{DTh}$ lower than $V_{UTh}$ before the base voltage of Q3 falls below $V_{BE}$ causing Q3 to turn off and hence the power-up circuit to reassert control and shut the output buffer down. Because Kantz allows the power-up threshold voltage $V_{UTh}$ to be set higher than the power-down threshold voltage $V_{DTh}$, it permits $V_{UTh}$ to be set higher than would be desirable when one has to select a single threshold which is to be a compromise between (1) providing adequate protection during power-up and (2) avoiding shutdowns for minor fluctuations in the power supply voltage.

Although the power-up circuit of Kantz allows separation of the threshold voltages $V_{UTh}$ and $V_{DTh}$, it is limited with regard to the fixing of the values of those threshold voltages by means other than selection of alternative resistance values. This is of particular concern given the types of variations observed in semiconductor-fabricated resistors, wherein resistance values as manufactured can be off from the design values by as much as 30%. Any alternative means used to change $V_{UTh}$ and $V_{DTh}$, such as by adding supplemental diode means to the circuit branch including transistor Q2 could bring the power-up circuit outside the range of acceptable operating conditions, particularly as required power supply levels are reduced. More fundamentally, Kantz is limited to TTL (bipolar) technology and is not adaptable for use in the more recent integrated circuitry utilizing both bipolar and MOSFET technology and designated as BiCMOS. Finally, it must be emphasized that none of the known prior-art circuits assert control until the power-supply-voltage is on the order of 2 $V_{BE}$. This can be a problem with many modern circuit stages, which may become active somewhat below 2 $V_{BE}$.

Therefore, what is needed is a BiCMOS power-up circuit having unequal threshold turn-on/turn-off characteristics wherein turn-on occurs at a higher threshold than turnoff and where the two thresholds can be adjusted independently of one another. In particular, what is needed is such a power-up circuit capable of asserting control at an up-threshold voltage clearly below 2 $V_{BE}$.

SUMMARY OF THE INVENTION

The present invention is a hysteretic BiCMOS power-up circuit designed to be integrated into a larger output-enable circuit ("the output-enable circuit"), which is part of a still larger extended logic circuit system ("the extended logic circuit"). The primary use envisioned for the circuit of the present invention is that of safeguarding an extended logic circuit from fragmentary operation during the period that the voltage from the power supply energizing it is not yet at a level needed for proper operation of the extended circuit. The circuit of the present invention asserts its safeguarding control during power up at an up-threshold voltage considerably higher than that achievable by the prior-art. (Another application envisioned for the present invention is for the setting of logic stages to a definite logic level, especially when they might otherwise be at an ambiguous mixed level. This application follows from the present invention's ability to provide an output signal $V_{PU}$ that will more certainly remain digital—i.e., in one of the two logic states of the binary system—than will that output provided directly by the varying power-supply-voltage $V_{ps}$.)

The turn-on/turn-off hysteresis of the present invention is caused by the presence of two turn-on branches—a primary branch and a secondary branch—coupled to the control node of a switching transistor which in turn governs an output transistor. The secondary turn-on branch is designed to remain blocking while $V_{ps}$ is ramping up, so that the up-threshold voltage level is determined by the characteristics of the primary turn-on branch, which is in fact similar to the branch utilized by the prior-art circuits. As with those circuits, the primary turn-on branch results in the switching transistor activating when $V_{ps}$ is about 4 $V_{BE}$; i.e., when the potential at the base of the switching transistor is essentially equal to 4 $V_{BE}$. With the present invention, as soon as the switching transistor turns on the secondary turn-on branch ceases to be blocking and begins providing an alternative path by which the base drive can reach the switching transistor. As a consequence, the switching transistor remains on even for power supply fluctuations causing $V_{ps}$ to fall below the up-threshold level $V_{ThU}$. That level at which the switching transistor of the present invention will turn off once it has begun conducting is established by the design of the secondary turn-on branch.

The secondary turn-on branch provided in the present invention includes a MOS transistor having a control node tied to $V_{PU}$ and a low-potential node tied to the base node of the switching transistor. When it is off, the MOS transistor is a high-impedance device offering no route for the base drive to reach the switching transistor. However, once the MOS transistor is on, it operates as an open-pass gate. As a result, the secondary turn-on branch can be designed to include additional components tailored to provide an alternative, lower down-threshold potential for which the switching transistor will turn off.

Another improvement provided by the present invention lies in the $V_{ps}$ level during power-up at which the power-up circuit first asserts control; $V_{BE}$ instead of the 2 $V_{BE}$ typical of the prior art. This is achieved by coupling tile output transistor essentially directly to the high-potential power rail so that only one base-to-emitter drop is required to turn that transistor on. That is, the output transistor is no longer operated as an emitter-follower. In the circuit of the present invention the output swing is CMOS compatible, coming to within $V_T$ of the voltage on the high-potential power rail. That is, the output of the present circuit can be used to drive CMOS circuitry, something that the circuit of Kantz is unable to do.

The operation of the present invention can be summed up as follows:
1) During power-up, commencing at $V_{ps} \approx V_{BE}$ the power-up circuit locks $V_{PU}$ at a level such that the output-enable circuit will remain in a known state—or disabled—until $V_{ps}$ reaches a level high enough to ensure that output transistors are either completely on or off; and
2) During steady-state operation of the extended circuit, the power-up circuit allows $V_{PU} \approx V_{ps}$ regardless of operational fluctuations in $V_{ps}$.

The circuit of the present invention has a hysteresis in its operation such that the up-threshold value of $V_{ps}$ is higher than the down-threshold value of $V_{ps}$.

PREFERRED EMBODIMENT OF THE INVENTION

Figure 1:
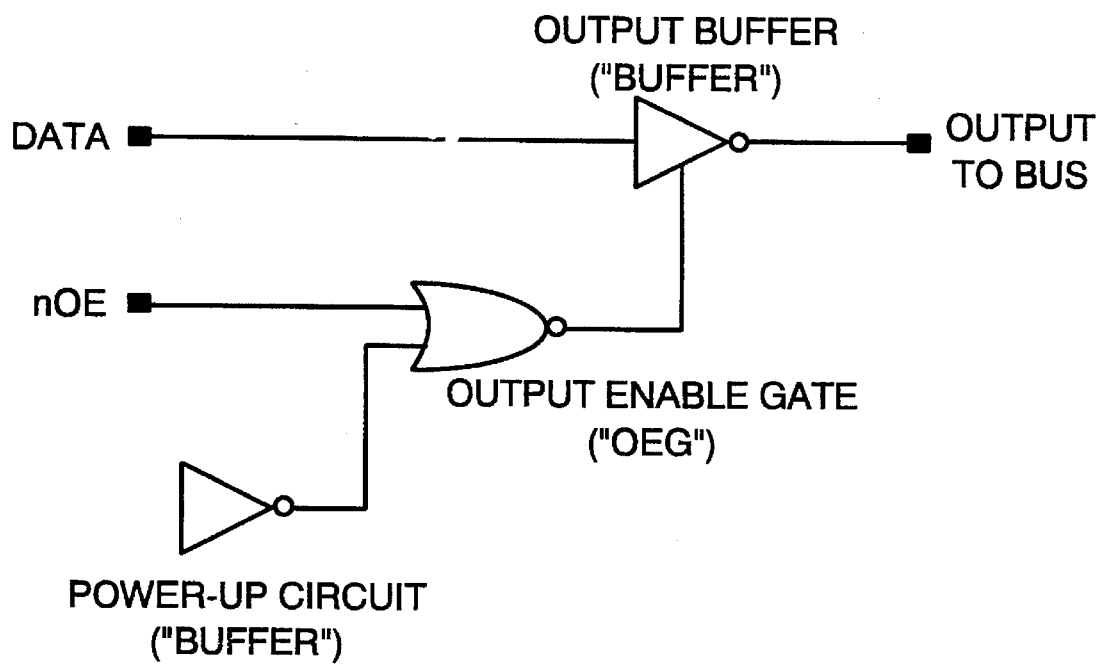
FIG. 1 is a simplified schematic diagram of a prior-art buffer-controlling circuit.
Figure 2:
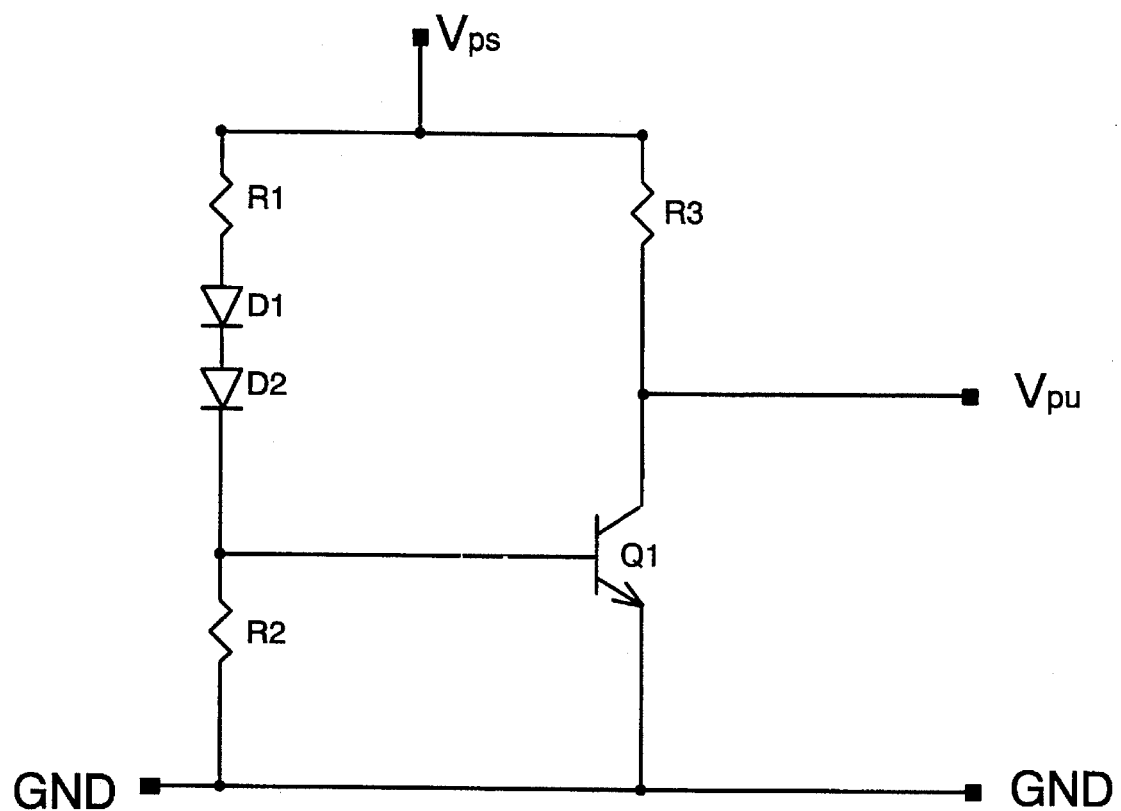
FIG. 2 is a simplified schematic diagram of a prior-art buffer-controlling circuit including a power-up circuit.
Figure 3:
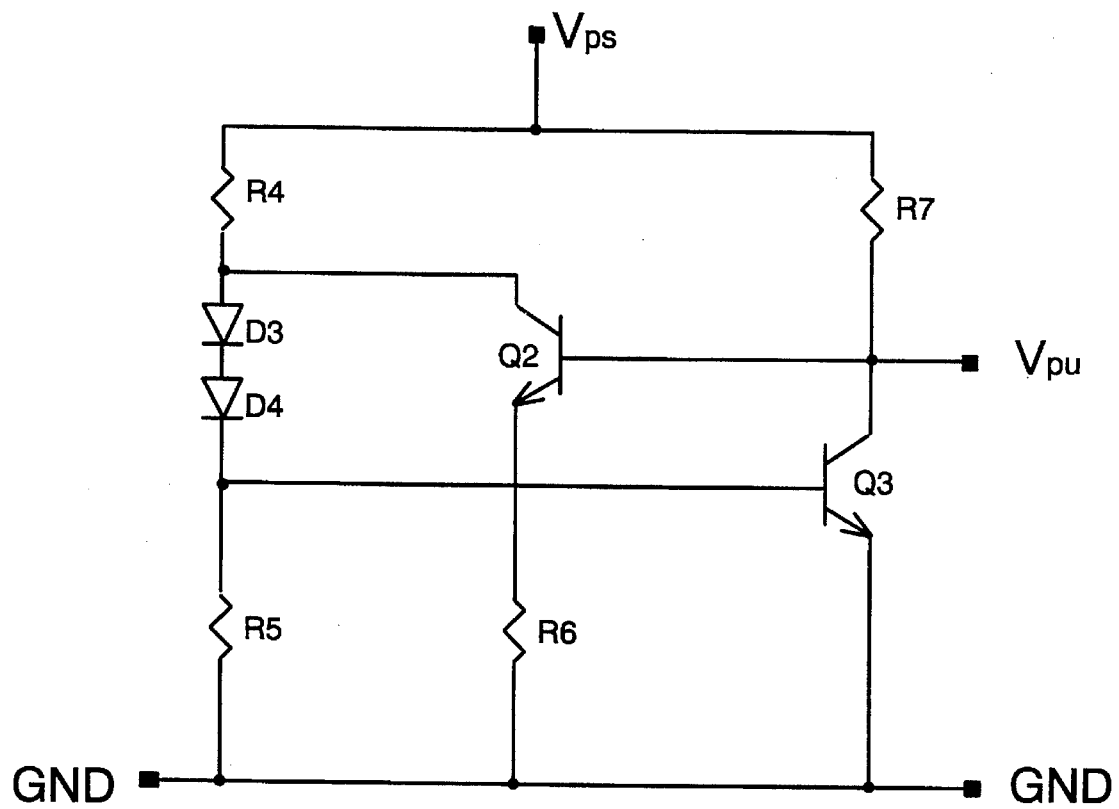
FIG. 3 is a simplified circuit diagram of a prior-art power-up circuit.
Figure 4:
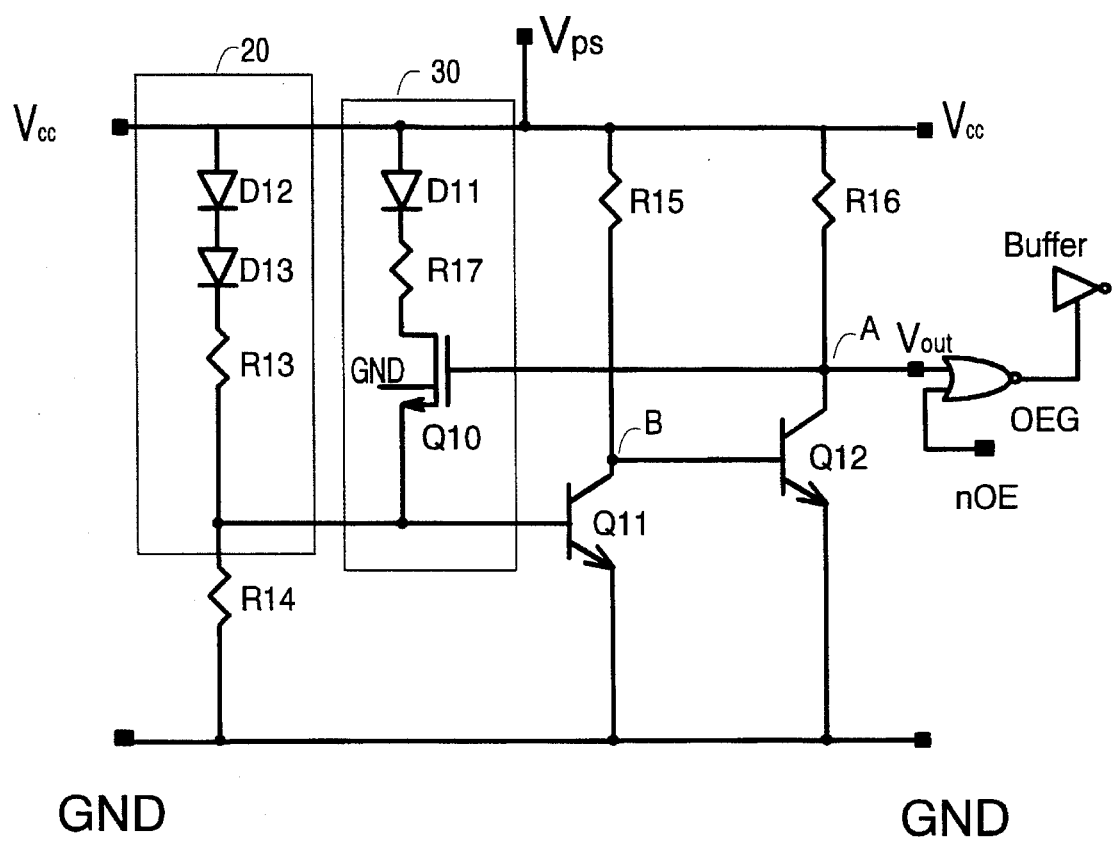
FIG. 4 is a simplified circuit diagram of the power-up circuit of the present invention.

A power-up circuit 10 of the present invention includes an output-controlling transistor Q12, a switching transistor Q11, a first switch turn-on branch 20, and a second switch turn-on branch 30, as shown in FIG. 4. The power-up circuit 10 of the present invention is preferably coupled to an output-enable gate (not shown) via a power-up circuit output node $V_{OUT}$. The power-up circuit 10 may be coupled through the output-enable gate to a buffer in order to assist in regulating the activation and deactivation (disabling) of the buffer, as has been previously described.

With continuing reference to FIG. 4, a collector node of the output-controlling transistor Q12 is seen to be coupled to output node $V_{OUT}$ at node A. The collector node of the output-controlling transistor Q12 is also coupled to a high-potential power rail $V_{CC}$ through a first resistor R16. (The high-potential power rail $V_{CC}$ is designed to be energized by a power supply—not shown—which supplies a power-supply-voltage $V_{ps}$.) An emitter node of the output-controlling transistor Q12 is coupled to a low-potential power rail GND. In the Preferred Embodiment of the present invention, a control node of the output-controlling transistor Q12 is also coupled to the high-potential power rail $V_{CC}$ directly through a second resistor R15 at node B. It is to be understood that additional circuit elements may be coupled between the control node of the output-controlling transistor Q12 and the high-potential power rail $V_{CC}$ in order to adjust the potential at which the output-controlling transistor Q12 will turn on. For example, one or more diode means, such as pn diodes or diode-connected transistors, may be coupled between the control node of the output-controlling transistor Q12 and the high-potential power rail $V_{CC}$.

As can be seen from FIG. 4, when the switching transistor Q11 is conducting (on), the control node of the output-controlling transistor Q12 is pulled close to the voltage of the low-potential power rail GND, resulting in the output-controlling transistor Q12 being held off. Conversely, when the switching transistor Q11 is not conducting (off), the control node of the output-controlling transistor Q12 will be pulled to a potential approaching that of the high-potential power rail $V_{CC}$, which—depending on the level of the power-supply-voltage $V_{ps}$ at that time—may or may not be sufficient to cause the output-controlling transistor Q12 to turn on. With the output-controlling transistor Q12 conducting the voltage at the output node, $V_{OUT}$ will be essentially equal to that of GND (a logic-low), and with the output-controlling transistor Q12 off, the voltage at the output node $V_{OUT}$ will be essentially at the voltage of the high-potential power rail $V_{CC}$ (which, depending on the power-supply-voltage, may be logic-high).

Switching the output-controlling transistor Q12 on or off at appropriate times, and ensuring that its state is unaffected by typical operational fluctuations in the power-supply-voltage $V_{ps}$ is the role of the switching transistor Q11. The switching transistor Q11 in turn is controlled by two separate turn-on paths coupled to the control node of the switching transistor Q11: a first turn-on path 20 and a second turn-on path 30. In the Preferred Embodiment, the first turn-on path 20 includes a first diode means D12, a second diode means D13, a first limiting resistor R13. It is to be understood that while the referenced diode means are shown in FIG. 4 as simple pn diodes, they may alternatively be diode-connected bipolar transistors or any other equivalent diode structure. As can be seen from FIG. 4, the first diode means D12 and the second diode means D13 are connected in series—as a diode stack—and oriented so as to be forward-biased when the voltage on the high-potential power rail exceeds the voltage on the low-potential power rail. One end of the diode stack is connected directly to the high-potential power rail; the other end is connected through the first limiting resistor R13 to the control node of the switching transistor Q11. In turn, the control node of the switching transistor Q11 is connected to the low-potential power rail GND through the second limiting resistor R14.

The components of the first turn-on branch 20 are selected so as to define the value of the voltage on the high-potential power rail $V_{CC}$ at which the switching transistor Q11 will be turned on. In a sense, this defines the time delay after the initiation of power-up before the switching transistor Q11 turns on, and consequently the output-controlling transistor Q12 turns off, pinning the voltage at the output node $V_{OUT}$ to that on the high-potential power rail $V_{CC}$. In the Preferred Embodiment both first diode means D12 and second diode means D13 are designed to conduct in the forward direction with a forward-bias voltage drop essentially equal to $V_{BE}$, the voltage drop across the base-to-emitter junction of the switching transistor Q11 when the switching transistor Q11 is conducting. The value of $V_{BE}$ depends on the materials used and, to a certain extent, on the fabrication process. Typically, $V_{BE}$ will be on the order of 0.9 volt. As can be seen from FIG. 4, switching transistor Q11 will turn on when the IR voltage drop across second limiting resistor R14 reaches $V_{BE}$. This will occur when the current through the first turn-on path 20 reaches $V_{BE}/R14$, where R14 is the resistance of second limiting resistor R14. As can be seen from FIG. 4, this will occur when the voltage on the high-potential power rail $V_{CC}$ reaches $V_{BE}[3+(R13/R14)]$, where R13 is the resistance of the first limiting resistor R13. In the Preferred Embodiment R13=R14, and so the switching transistor Q11 turns on when the up-ramping voltage on the high-potential power rail $V_{CC}$ passes 4 $V_{BE}$. In general it is possible to fabricate the circuit of the present invention with R13≠R14. Moreover, those skilled in this art will understand that the noted components of first branch 20 may be sized, arranged, or changed in number in order to customize the voltage required on the high-potential power rail at which the switching transistor Q11 will be turned on during power-up.

A key feature of the present invention is the second turn-on branch 30. In order to isolate the switching transistor Q11 from variations in the potential of $V_{CC}$ when an extended circuit to which the controlled buffer is connected is operating, it is necessary to provide a distinct and separate turn-on capability. That is achieved by connecting the second turn-on branch 30 to the control node of the switching transistor Q11. In the Preferred Embodiment of the invention, shown in FIG. 4, the second turn-on branch 30 includes a third diode means D11, a third limiting resistor R17, and a switch-regulating transistor Q10. A second limiting resistor R14 may be coupled to the common low-potential node of the first turn-on path 20 and the second turn-on path 30, and the low-potential power rail GND. The third diode means D11 may be a pn diode as illustrated, or it may be a diode-connected bipolar transistor, etc. In the Preferred Embodiment the third diode means D11 is oriented to be normally forward-biased diode and is connected between the high-potential power rail $V_{CC}$ and the switch-regulating transistor Q10 via the third limiting resistor R17. The principal conduction path of the—switch-regulating transistor Q10 is between the third limiting resistor R17 and the control node-of the switching transistor Q11. A control node of the switch-regulating transistor Q10 is connected directly to the output node $V_{OUT}$. Note that this ensures that the control node of the switch-regulating transistor Q10 is also connected directly to the collector node of the output-controlling transistor Q12.

With continuing reference to FIG. 4, it can be seen that in the Preferred Embodiment a substrate node of switch-regulating transistor Q10 is connected to the low-potential power rail GND. Thus, with the control node of switch-regulating transistor Q10 connected to the collector of the output-controlling transistor Q12, the switch-regulating transistor Q10 will be conducting only if output-controlling transistor Q12 is not conducting. Thus switch-regulating transistor Q10 can turn on during power-up only after the first turn-on branch 20 turns on switching transistor Q11 that in turn turns off output-controlling transistor Q12.

The power-up circuit 10 of the present invention is designed so that only the first branch 20 can turn on switching transistor Q11 during initial power-up. However, once this happens, the second turn-on branch 30 takes over the control of the switching transistor Q11. Once conducting, the switching transistor Q11 will remain conducting as long as enough current goes through second limiting resistor R14 to maintain the control node of the switching transistor Q11 at a level $V_{BE}$. Before the current-regulating transistor Q10 turns on, the current through that second limiting resistor R14 comes entirely from the first turn-on path 20. As has just been shown, however, once that current has risen high enough to turn on the switching transistor Q11, the second turn-on path 30 also contributes to the current through the second limiting resistor R14. As with the first turn-on branch 20, the third diode means D11 and the third limiting resistor R17 of the second turn-on branch 30 may be varied in size, arrangement, and number in order to adjust the down-ramping threshold level $V_{ThD}$ at which control node drive (base drive) will be removed from the switching transistor Q11. In the Preferred Embodiment the third diode means D11 is designed with the same characteristics as those of the first diode means D12 and the second diode means D13, and third limiting resistor R17 is designed with the same characteristics as those of the first limiting resistor R13 and the second limiting resistor R14. With those conditions, the voltage required on the high-potential power rail $V_{CC}$ to maintain the switching transistor Q11 conducting is only 3 $V_{BE}$—a level sufficiently low enough to avoid unanticipated, unnecessary turn-offs (power-downs of the extended circuit) due to operational fluctuations of the power-supply voltage $V_{ps}$, yet sufficiently high to ensure that the voltage on the output node $V_{OUT}$ is pulled down to a definitive logic-low before the voltage on the high-potential power rail $V_{CC}$ falls into the ambiguous region between the logic-high range and the logic-low range.

Although current-regulating Q10 has been described in general terms, it is, in the Preferred Embodiment of the invention, an NMOS transistor having its gate coupled to the collector of the output-controlling transistor Q12. Its substrate is preferably tied to GND, and its source node is coupled to the control node of transistor Q11. In that regard, the gate of the output-controlling transistor Q10 is ensured to be at or near the full potential of $V_{CC}$ so that the transistor will be fully on, and will remain on in the event typical fluctuations occur. The use of an NMOS transistor for the current-regulating transistor Q10 results in the power-up circuit 10 having the advantage that the second turn-on path 30 requires less power (than would e.g. a second turn-on path utilizing bipolar technology). Ganging this MOS branch with a first turn-on path utilizing bipolar technology, with its typical fast switching times is obviously advantageous in comparison with purely bipolar power-up circuits such as exist in the prior art.

Figure 5:
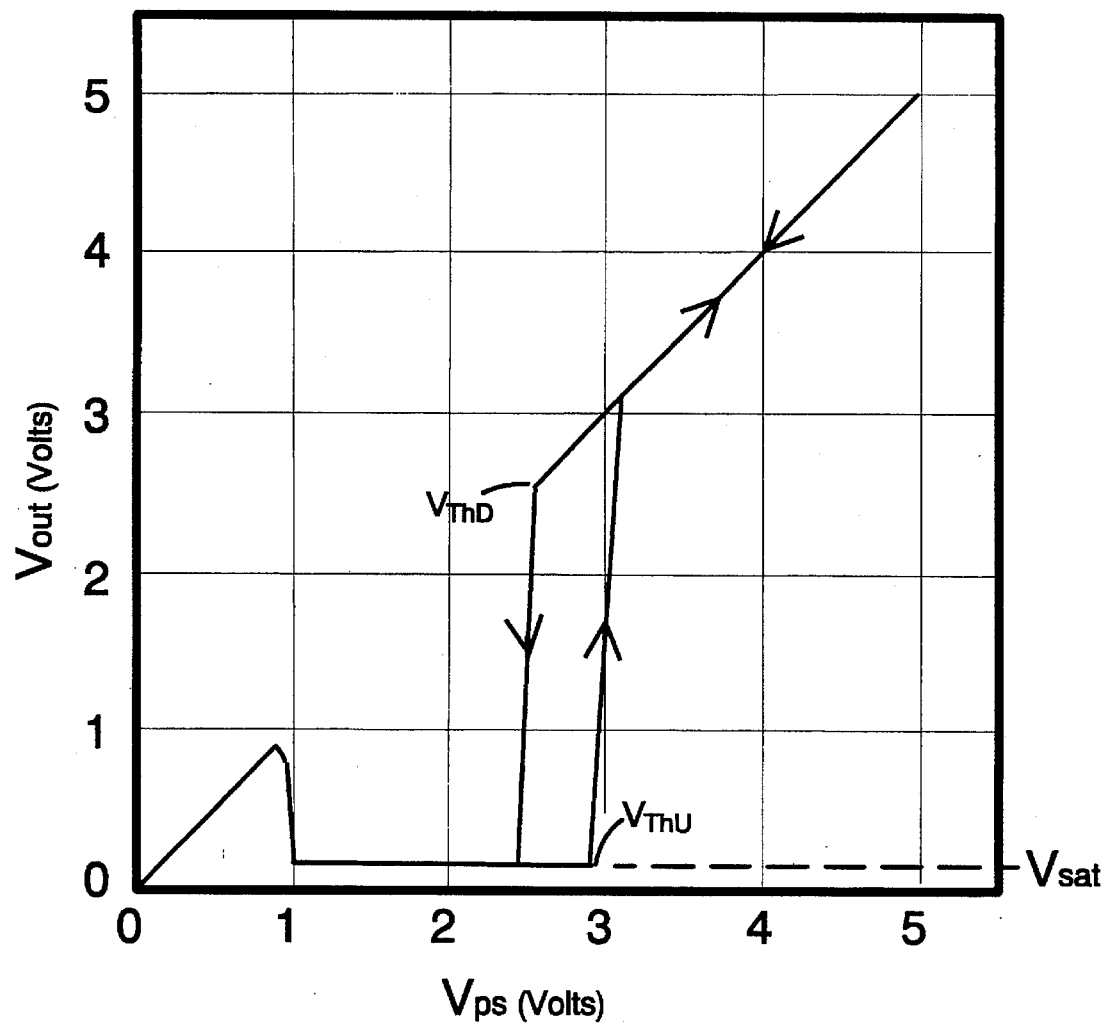
FIG. 5 is a graph of the operation of the preferred embodiment of the present invention as the power supply voltage coupled to $V_{CC}$ ramps up and down.

FIG. 5 shows the voltage on the output node $V_{OUT}$ as a function of the power-supply voltage $V_{ps}$ supplied to the high-potential power rail $V_{CC}$ for the Preferred Embodiment of the present operation. Referring to FIG. 5 and to FIG. 4, the Preferred Embodiment circuit can be seen to work as follows. At power-up, the power-supply voltage $V_{ps}$ ramps up from 0 to typically 5 Volts over a few milliseconds. During this ramp-up, the voltage at the output node $V_{OUT}$ will initially track (be equal to) the voltage on the high-potential power rail $V_{CC}$. At quite low power-supply $V_{ps}$ voltages, however—approximately $V_{BE}$—the output-controlling transistor Q12 will turn on, dropping the voltage at the output node $V_{OUT}$ to within $V_{SAT}$ of the voltage on the low-potential power rail GND. On FIG. 5, this is represented by the break in the curve for the power-supply voltage $V_{ps}$ equal to something less than 1.0 volt.

The next thing that happens during ramp-up is the turn-on of the switching transistor Q11, which occurs at a voltage $V_{ThU}$—the up-threshold—as shown on FIG. 5. From that point on during the ramp-up the voltage at the output node $V_{OUT}$ continues to track the power-supply voltage $V_{ps}$. In particular, it is equal to the power-supply voltage $V_{ps}$ after that voltage has stabilized at the design voltage for the high-potential power rail $V_{CC}$ (typically around 5 volts). If and when the power-supply voltage $V_{ps}$ subsequently decreases, either because the circuit is being powered down or because of fluctuations in the power-supply voltage $V_{ps}$ due to temperature, demand, etc., the voltage at the output node $V_{OUT}$ will track the power-supply voltage $V_{ps}$ until that voltage goes below a level $V_{ThD}$—the down-threshold. For reasons explained above and as can be seen from FIG. 4, $V_{ThD}<V_{ThU}$. This accounts qualitatively for the hysteresis shown in FIG. 5. In particular, in the Preferred Embodiment of the present invention $V_{ThD} \approx (V_{ThU-VBE})$.

During power-up, it is advantageous for the voltage at the output node $V_{OUT}$ to drop to $V_{SAT}$ before the power-supply voltage $V_{ps}$ has risen very far. This is because it is necessary to have the voltage at the output node $V_{OUT}$ solidly logic-low very early on, before the voltage on the high-potential power rail $V_{CC}$ has gotten up to magnitudes where it can cause problems if it is supplied to the extended heterogeneous circuit. With integrated circuits presently being utilized such problems can occur as low as $V_{CC}=2 V_{BE}$ or even somewhat lower. Thus, an important aspect of The Preferred Embodiment of the present invention is that it takes control of the extended circuit beginning at a $V_{CC}$ voltage of $V_{BE}$. Also, during the up-ramping it is desirable to have the power-up circuit holdoff the energizing of the circuit—i.e., the application of the power-supply voltage $V_{ps}$ to the rest of the circuit—until that power-supply voltage $V_{ps}$ is solidly in the logic-high range. The power-up circuit of the present invention facilitates this.

In summary, the Preferred Embodiment of the power-up circuit of the present invention maintains control of the extended circuit's energizing from the point where the up-ramping power-supply voltage $V_{ps}$ reaches approximately $V_{BE}$ up to the point where the up-ramping power-supply voltage $V_{ps}$ reaches an up-threshold voltage $V_{ThU}$ of approximately $4 V_{BE}$. Thereafter, it exercises no control over the extended circuit until the power-supply voltage $V_{ps}$ falls to a down-threshold voltage $V_{ThD}$ of approximately $3 V_{BE}$. The use of the word "hysteresis" here is in reference to the fact that $V_{ThU} \neq V_{ThD}$ and in particular to the fact that $V_{ThU} > V_{ThD}$.

Although the Preferred Embodiment of the present invention has been described here in some detail with the various circuit elements well-defined and arranged in specific ways, this description is merely illustrative. Further modification of the power-up circuit of the present invention as generally disclosed herein will be clear to those skilled in the art. All such modifications and equivalents of the present invention are claimed to be within the scope of the invention as defined by the appended claims.

I claim:

1. A power-up circuit for controlling energizing of an extended circuit, said power-up circuit comprising:

a. a switching transistor having a high-potential node coupled through a first resistive means to a high-potential power rail, a low-potential node coupled to a low-potential power rail, and a control node;

b. an output-controlling transistor having a control node coupled to said high-potential node of said switching transistor, a high-potential node coupled to an output node and to said high-potential power rail through a second resistive means, and a low-potential node coupled to said low-potential power rail; and c. a first turn-on sub-circuit and a second turn-on sub-circuit, said second turn-on sub-circuit having a diode means, where said first turn-on sub-circuit is connected in parallel to said second turn-on sub-circuit and both are coupled between said high-potential power rail and said control node of said switching transistor, wherein said second turn-on sub-circuit incorporates MOS circuitry, wherein said MOS circuitry of said second turn-on sub-circuit includes a MOS regulating transistor, wherein a low-potential node of said MOS regulating transistor is coupled to said control node of said switching transistor, and a control node of said MOS regulating transistor is coupled to said output node.

2. The power-up circuit as claimed in claim 1 wherein said second turn-on sub-circuit also includes said diode means coupled between said high-potential power rail and a high-potential node of said MOS regulating transistor.

3. The power-up circuit as claimed in claim 2 wherein said diode means of said second turn-on sub-circuit is a primary diode means and wherein said first turn-on sub-circuit includes a secondary diode means coupled between said high-potential power rail and said control node of said switching transistor.

4. The power-up circuit as claimed in claim 3 wherein said first turn-on sub-circuit further includes a third diode means coupled between a low-potential node of said secondary diode means and said control node of said switching transistor.

5. The power-up circuit as claimed in claim 4 wherein said primary diode means is a diode-connected bipolar transistor.

6. The power-up circuit as claimed in claim 4 wherein said secondary diode means and said third diode means are diode-connected bipolar transistors.

7. The power-up circuit as claimed in claim 6 wherein said output-controlling transistor is a bipolar transistor having a collector as said high-potential node thereof, an emitter as said low-potential node thereof, and a base as said control node thereof, wherein said collector of said output-controlling transistor is coupled to said output node and to said high-potential power rail, wherein said emitter of said output-controlling transistor is coupled to said low-potential power rail, and said base of said output-controlling transistor is coupled to said high-potential node of said switching transistor.

8. The power-up circuit as claimed in claim 7 wherein said switching transistor is a bipolar transistor having a collector as said high-potential node thereof, an emitter as said low-potential node thereof, and a base as said control node thereof, wherein said collector of said switching transistor is coupled to said high-potential power rail, said emitter of said switching transistor is coupled to said low-potential power rail, and said base of said switching transistor is coupled to said first turn-on sub-circuit and to said second turn-on sub-circuit.

9. The power-up circuit as claimed in claim 8 wherein said MOS-regulating transistor is an NMOS transistor having a source coupled to said base of said switching transistor, a drain coupled to said primary diode means, and a gate coupled to said collector of said output-controlling transistor.

10. A power-up circuit for controlling the operation of an output buffer, said power-up circuit comprising:

a. a bipolar switching transistor having a collector node coupled to a high-potential power rail;

b. a bipolar output-controlling transistor having a collector node coupled to an output node, an emitter node coupled to a low-potential power rail, and a base node coupled to said collector node of said switching transistor;

c. a first turn-on sub-circuit having a first diode-connected bipolar transistor coupled to said high-potential power rail, a second diode-connected bipolar transistor coupled to said first diode-connected bipolar transistor and to a base node of said switching transistor; and d. a second turn-on sub-circuit having a third-diode connected bipolar transistor coupled to said high-potential power rail and to a drain node of an NMOS regulating transistor, said NMOS regulating transistor having a source node coupled to said base node of said switching transistor, and a gate node coupled to said collector node of said output-controlling transistor.

11. The power-up circuit of claim 10 used as a reset circuit for extended logic circuitry.

12. The power-up circuit of claim 10 used to set logic stages at definite logic levels.

13. A method for controlling energizing of an output buffer device, said method comprising the steps of:

a. connecting an input of said output buffer device to an output of a power-up circuit;

b. turning on an output transistor of said power-up circuit connected to said output;

c. turning on a switching transistor of said power-up circuit using a first switch turn-on sub-circuit;

d. controlling activation of said output transistor by coupling said first turn-on sub-circuit to said control node of said switching transistor; and e. redirecting control of said switching transistor from said first switch turn-on sub-circuit to a second switch turn-on sub-circuit coupled to said control node of said switching transistor by turning on said second switch turn-on sub-circuit.

* * * * *